US006776696B2

(12) United States Patent
Mahulikar et al.

(10) Patent No.: US 6,776,696 B2
(45) Date of Patent: Aug. 17, 2004

(54) CONTINUOUS CHEMICAL MECHANICAL POLISHING PROCESS FOR POLISHING MULTIPLE CONDUCTIVE AND NON-CONDUCTIVE LAYERS ON SEMICONDUCTOR WAFERS

(75) Inventors: Deepak Mahulikar, Madison, CT (US); Richard J. Jenkins, Queen Creek, AZ (US)

(73) Assignee: Planar Solutions LLC, Adrain, MI (US)

( * ) Notice: Subject to any disclaimer, the term of this patent is extended or adjusted under 35 U.S.C. 154(b) by 0 days.

(21) Appl. No.: 10/281,905

(22) Filed: Oct. 28, 2002

(65) Prior Publication Data

US 2004/0082275 A1 Apr. 29, 2004

(51) Int. Cl.$^7$ ................................................ B24B 1/00
(52) U.S. Cl. ............................... 451/57; 451/8; 451/11; 451/36; 451/41; 451/60; 451/286; 451/287; 451/288; 438/690; 438/691; 438/692; 438/693
(58) Field of Search ................................ 451/8, 11, 36, 451/41, 60, 286, 287, 288; 438/690, 691, 692, 693

(56) References Cited

U.S. PATENT DOCUMENTS

| 5,928,961 | A | * | 7/1999 | Lou et al. .................... 438/692 |
| 6,083,840 | A | * | 7/2000 | Mravic et al. ............... 438/693 |
| 6,114,249 | A |   | 9/2000 | Canaperi et al. |
| 6,468,913 | B1 |   | 10/2002 | Pasqualoni et al. |
| 6,506,097 | B1 | * | 1/2003 | Adams et al. ................. 451/5 |
| 6,569,690 | B1 | * | 5/2003 | Houge et al. .................. 438/8 |

OTHER PUBLICATIONS

Kumar et al. "Chemical–Mechanical Polishing of Copper in Glycerol Based Slurries," Center for Intergrated Electronics and Electronics manufacturing, Rensselaer Polytechnic Institute, Troy, New York, no date.
Stavreva et al. "Chemical–Mechanical Polishing of Copper for Interconnect Formation;" Elsevier Science B.V., 1997.
Luo et al. "Stabilization of Alumina Slurry for Chemical–Mechanical Polishing of Copper;"Langmuir 1996, 12, 3563–3566.
Gutmann et al. "Chemical–Mechanical Polishing of Copper With Oxide and Polymer Interlevel Dielectrics;" Elsevier Science, S.A. 1995.
Carpio et al. "Initial Study on Copper CMP Slurry Chemistries." Elsevier Science, S.A. 1995.

* cited by examiner

Primary Examiner—Joseph J. Hall, III
Assistant Examiner—Shantese L. McDonald
(74) Attorney, Agent, or Firm—Ohlandt, Greeley, Ruggiero & Perle, L.L.P.

(57) ABSTRACT

A continuous CMP process for polishing multiple conductive and non-conductive layers on a semiconductor substrate. The continuous process comprises the steps of: (a) disposing a substrate on a platen; (b) polishing a first layer using both a mechanical means and a chemical means; and (c) polishing a second layer upon adjusting at least one parameter in either the mechanical means, chemical means, or both.

72 Claims, No Drawings

CONTINUOUS CHEMICAL MECHANICAL POLISHING PROCESS FOR POLISHING MULTIPLE CONDUCTIVE AND NON-CONDUCTIVE LAYERS ON SEMICONDUCTOR WAFERS

The present invention relates to a chemical mechanical polishing process used in semiconductor manufacturing. More particularly, the present invention relates to a continuous chemical mechanical polishing process for polishing multiple conductive and non-conductive layers on a semiconductor substrate.

BACKGROUND OF THE INVENTION

Semiconductors are typically made up of millions of active devices that are connected together via metal interconnections to form circuits and components. The active devices are interconnected by a well-known multilayer interconnect process. In a typical interconnect process, alternating layers of metal and dielectric are put on the silicon wafer by a variety of processes. After each layer is applied, a means is used to remove excess amounts of these layers and to assure both local and global planarity of the surface in preparation for the application of the next layer.

A common process used to accomplish these goals is chemical mechanical polishing (CMP). In this process, an aqueous solution containing various chemicals and suspended abrasive particles, namely, a slurry, is interposed between the wafer and a moving pad or platen while pressure is applied. The combination of the mechanical effects of the abrasive particles from the applied pressure and imposed relative velocity, and the chemical effects that result from a chemical reaction between the material being polished and constituents in the solution result in a synergistic enhancement of the polishing rate or material removal rate. That is, the material removal rate is higher than that produced by either the mechanical effects or chemical effects alone.

There are two general types of layers that can be polished. The first type of layers are interlayer dielectrics (ILD), such as, silicon oxide and silicon nitride. The second type of layers are metal layers, such as, tungsten, copper, aluminum, etc., which are used to connect the active devices.

In the case of CMP of metals, the chemical action is generally considered to take one of two forms. In the first mechanism, the chemicals in the solution react with the metal layer to continuously form an oxide layer on the surface of the metal. This generally requires the addition of an oxidizer to the solution, such as, hydrogen peroxide, ferric nitrate, etc. Thereafter, the mechanical abrasive action of the particles continuously and simultaneously removes this oxide layer. A judicious balance of these two processes obtains optimum results in terms of removal rate and polished surface quality.

In the second mechanism, no protective oxide layer is formed. Instead, the constituents in the solution chemically attack and dissolve the metal, while the mechanical action is largely one of mechanically enhancing the dissolution rate by such processes as continuously exposing more surface area to chemical attack, raising the local temperature (which increases the dissolution rate) by the friction between the particles and the metal, enhancing the diffusion of reactants and products to and away from the surface by mixing, and by reducing the thickness of the boundary layer.

A number of systems for chemical-mechanical polishing of copper have been disclosed. Kumar et al. in an article entitled "Chemical-Mechanical Polishing of Copper in Glycerol Based Slurries" (*Materials Research Society Symposium Proceedings*, 1996) disclose a slurry that contains glycerol and abrasive alumina particles. An article by Gutmann et al. entitled "Chemical-Mechanical Polishing of Copper with Oxide and Polymer Interlevel Dielectrics" (*Thin Solid Films*, 1995) discloses slurries based on either ammonium hydroxide or nitric acid that may contain benzotriazole (BTA) as an inhibitor of copper dissolution. Luo et al. in an article entitled "Stabilization of Alumina Slurry for Chemical-Mechanical Polishing of Copper" (*Langmuir*, 1996) discloses alumina-ferric nitrate slurries that contain polymeric surfactants and BTA. Carpio et al. in an article entitled "Initial Study on Copper CMP Slurry Chemistries" (*Thin Solid Films*, 1995) disclose slurries that contain either alumina or silica particles, nitric acid or ammonium hydroxide, with hydrogen peroxide or potassium permanganate as an oxidizer.

There are a number of theories as to the mechanism for chemical-mechanical polishing of copper. An article by Zeidler et al. (*Microelectronic Engineering*, 1997) proposes that the chemical component forms a passivation layer on the copper, changing the copper to a copper oxide. The copper oxide has different mechanical properties than metallic copper, such as, density and hardness, and passivation changes the polishing rate of the abrasive portion. The above article by Gutmann et al. discloses that the mechanical component abrades elevated portions of copper and the chemical component then dissolves the abraded material. The chemical component also passivates recessed copper areas minimizing dissolution of those portions.

Currently, the CMP process, and in particular the copper CMP process, is a two step process, primarily because the tantalum (Ta) barrier is difficult to polish at high removal rates. In the first step of the two-step process, the substrate to be polished is positioned on a platen. While applying mechanical forces to the platen (i.e., downwardly applied force and/or rotational speed), the slurry, in combination with the mechanical forces, polishes the copper layer rapidly, until the desired copper removal is achieved. Typical copper removal rates are from 5000 to 10000 Å/min for a commercial step 1 slurry. Prior to performing the second step, it is necessary to stop the CMP process after the first step, remove the substrate from the platen and position it on another platen and/or change the slurry composition to change metal selectivity. Once the appropriate changes are made, the second step is performed where the copper removal rate is significantly reduced and the tantalum layer is polished. One approach is outlined in the U.S. Pat. No. 6,083,840 to Mravic et al. where copper, tantalum and oxide removal rates are almost equal to get the best topography. Inherent with the two-step process is limited throughputs and high cost of ownership, which includes, for example, consumable costs, cost of the tool and metrology, cost of slurry distribution, and cost of waste treatment. In a two step process, one may end up using two separate platens, two separate pads, two slurries, and different filters and waste treatments, all of which contributes to excess costs and time consumption.

In a conventional copper CMP two step process, a polishing machine with three platens may be used. A wafer is placed on a first platen that polishes copper only with a step 1 slurry at high rates. After a rinsing step, the wafer is then transferred to a second platen that polished tantalum with a step 2 slurry. After another rinse, the wafer is transferred to a third platen for a buff clean. The time per wafer is about 3 minutes total or about 20 wafers per hour. On a single platen machine, such as one sold by Strasbaugh or Ebara, all steps of the process noted above have to be done on the same platen. As a result, throughput is further reduced since the single platen and associated equipment must be changed for each step, rather than just moving the wafer to a different platen already set up for the desired task, such as on the three platen machine described above. The common drawback, despite the type of system used, is that the polishing process must be stopped several times to allow for process changes.

U.S. Pat. No. 6,114,249 to Canaperi et al. (Canaperi) discloses a CMP polishing process for polishing a material in a multiple material substrate. A slurry is used to polish a first layer until a major portion of the first layer is removed. Triethanolamine is added to the slurry without interrupting the polishing of the substrate to increase the selectivity of the slurry towards the first material layer being polished. the polishing continues until the first material layer is completely removed from the underlying portions of a second material layer so that the first material layer is coplanar with the second material layer. The patent does not disclose the continuous CMP polishing of multiple layers of material on a substrate.

The present invention overcomes the drawbacks and disadvantages of the current two-step CMP process by providing a continuous CMP process that results in comparable or superior polishing to that of the current two-step, non-continuous process. With the continuous process, multiple conductive and non-conductive layers on a substrate can be polished continuously without having to remove the substrate from the original platen on which it was positioned. This eliminates any platen to platen transfer time. Since the same slurry foundation is used, one does not need to worry about multiple slurries, pads, filters or distribution systems. The use of the one-step process results in a significant increase in throughput and a significant decrease in cost of ownership, compared to that of present two-step processes. The present invention also provides many additional advantages, which shall become apparent as described below.

SUMMARY OF THE INVENTION

The present invention relates to a novel, continuous CMP process for polishing multiple conductive and non-conductive layers on a semiconductor substrate. The continuous process comprises the steps of:

(a) disposing a substrate on a platen;

(b) polishing a first layer using both a mechanical means and a chemical means; and (c) polishing a second layer upon adjusting at least one parameter in either the mechanical means, chemical means, or both.

With the CMP process of the present invention, multiple conductive and/or non-conductive layers on the substrate are polished continuously without the need to transfer the substrate to an additional platen for the application of a second CMP slurry. The first layer is polished until the desired level of removal is detected. Then, by adjusting at least one process parameter in situ, the layer polishing selectivity and/or the overall polishing rate can be adjusted, allowing for the polishing of additional layers on the substrate.

The present invention is also directed to a continuous process for polishing a substrate having a least a first layer and a second layer disposed thereon, the process comprising the steps of:

(a) disposing said substrate on a platen;

(b) polishing said first layer using both mechanical means and a composition comprising at least one abrasive and at least one oxidizer;

(c) adding one or more modifying agents to said composition of step (b) thereby adjusting a polishing selectivity of said composition; and (d) polishing said second layer using both mechanical means and said composition of step (c).

DETAILED DESCRIPTION OF THE INVENTION

It has been found that by making in situ process parameter changes, a continuous CMP process results that is capable of polishing multiple, conductive and/or non-conductive layers on a semiconductor substrate. As a result of the continuous process, multiple layers on a substrate can be polished without having to stop the process to change the mechanical and/or chemical parameters of the CMP process. This results in significant throughput increases and cost of ownership reductions.

The CMP process parameter that is adjusted in situ according to the present invention includes, for example, chemical parameters, mechanical parameters, or combinations thereof. Suitable chemical parameters that may be adjusted include, for example, the slurry temperature, the slurry components, the slurry pH, the slurry concentration, or any combinations thereof. By adjusting one or more chemical parameters, the polishing selectivity can be adjusted, thus resulting in an adjustment in the overall polishing rate and/or the polishing rate of specific layers of material being polished. The polishing of additional layers can also be initiated by adjusting one or more chemical parameters in situ.

The temperature of the slurry can be adjusted to between about 50° F. to about 150° F. to effect a change in polishing selectivity. Preferably, the slurry temperature is adjusted to between about 70° F. to about 100° F.

The components of the slurry that may be adjusted, include, for example, oxidizers, stabilizers, corrosion inhibitors, catalysts, complexants, surfactants, and combinations thereof.

The pH of the slurry can be adjusted to between about 2 to about 12 to effect a change in polishing selectivity. Preferably, the slurry pH is adjusted to between about 3 to about 11.

The slurry concentration may be adjusted in such a manner that the selectivity of the slurry is adjusted according to the layer to be polished. Suitable means for adjusting the slurry concentration include, for example, dilution with water, addition of chemical solutions or modifying agents, or combinations thereof. Suitable chemical solution may include, for example, rate enhancers, oxidizers, surfactants, catalysts, corrosion inhibitors, pH adjusters, or any combinations thereof.

Suitable mechanical parameters that may be adjusted include, for example, the platen rotational speed, the platen down force, platen back pressure, slurry flow rates, and any combinations thereof. By adjusting the mechanical parameters, the overall polishing rate for the various layers being polished on the substrate can be adjusted in situ.

The platen rotational speed may be adjusted to between about 20 to about 200 revolutions per minute (rpm) to effect a change in the polishing rate. Preferably, the platen rotational speed is adjusted to between about 30 to about 150 rpm.

The platen downwardly applied force may be adjusted to between about 1 to about 10 pounds per square inch (psi) to effect a change in the polishing rate. Preferably, the platen down force is adjusted to between about 2 to about 8 psi.

The slurry flow rate can be adjusted to between about 10 ml/min and 500 ml/min to adjust the polishing rate and/or selectivity.

The first layer to be polished may include one or more materials, such as, for example, copper, aluminum, tungsten, noble metals, or composite metals. In a preferred embodiment, the first layer to be polished includes copper.

The second layer to be polished may include one or more materials, such as, for example, tantalum, tantalum nitride, titanium, titanium nitride, tungsten, tungsten nitride, other barrier metals, or composites. In a preferred embodiment of the present invention, the second layer polished includes tantalum.

By employing the continuous process of the present invention, overall polishing times can be reduced by about 33% as set forth in Table 1 below. This reduction in time results in significant throughput increases and reduction in cost of ownership.

TABLE 1

Polishing Time Comparisons
Single Platen Tool

| | Step 1 Polish (Cu) | Rinse | Step 2 Polish (Ta) | Rinse | Total Polish Time |
|---|---|---|---|---|---|
| Two-Step Process | 2 min. | 20 sec. | 1 min. | 20 sec. | 3 min. 40 sec. |
| Single Step Continuous Process | 2.5 min. (Cu and Ta) | 20 sec. | Not required | Not required | 2 min. 50 sec. |

When using a three platen polisher and a two step process, it typically takes about 3 minutes to polish a wafer. With the continuous single step process of the present invention, two platens on the three platen polisher used in parallel allow each wafer to be polished in about 1.5 to 1.75 minutes.

The CMP slurry is initially formulated to have a selectivity towards the first material or layer to be polished. Any suitable CMP slurry can be used that is capable of polishing the first layer. In a preferred embodiment of the present invention, the CMP slurry is capable of polishing copper at a high removal rate of >2500 Å/min and has a tantalum removal rate less than about 800 Å/minute.

By way of example, suitable copper CMP slurry compositions may include components, such as, abrasives, oxidizers, stabilizing agents, surfactants, acids, corrosion inhibitors, fluorine-containing compounds, chelating agents, amines, salts, or combinations thereof.

The abrasives may be any material that is effective at removing metal and silica layers. Silica is the preferred abrasive material used in the present invention. The silica may be, for example, colloidal silica, fumed silica and other silica dispersions, however, the preferred silica is fumed silica. Preferably, the abrasive is present in the slurry in a concentration of about 0.5% to 40% of the total weight of the slurry. More preferably, the abrasive is present in a concentration of about 1% to 20% of the total weight of the slurry. Most preferably, the abrasive is present in a concentration of about 1% to 15% of the total weight of the slurry.

In addition, other ceramics, such as, alumina ($Al_2O_3$) and ceria ($CeO_2$) may also be utilized as an abrasive in the slurry composition.

Preferably, $H_2O_2$ is used as the oxidizing agent in the present invention. Preferably the concentration of the oxidizing agent is from about 0.01% to 10% of the total weight of the slurry. When used with silica, the oxidizing agent is present in a concentration from about 0.03% to 4% of the total weight of the slurry.

Other suitable oxidizing agents may be utilized. For example, potassium ferricyanide, potassium dichromate, potassium iodate, potassium bromate, vanadium trioxide, hypochlorous acid, sodium hypochlorite, potassium hypochlorite, calcium hypochlorite, magnesium hypochlorite, ferric nitrate, various ammonium salts such as ammonium persulfate, $KMgO_4$, and mixtures thereof, are suitable oxidizing agents.

In order to maintain the pH of the slurry composition, a stabilizing agent may be added so that the pH of the slurry is about 9 to 11, and more preferably, about 9 to 10. Suitable stabilizing agents include, for example, ammonium hydroxide and potassium hydroxide. These stabilizing agents may be present in the slurry in a concentration of about 0.001% to 1%, and more preferably in a concentration of about 0.01% to 0.10% of the total weight of the slurry.

Suitable surfactant compounds that may be added to the slurry composition include, for example, any of the numerous nonionic, anionic, cationic or amphoteric surfactants known to those skilled in the art. The surfactant compounds may be present in the slurry composition in a concentration of about 0.0001% to 1% and are preferably present in a concentration of about 0.001% to 0.1% of the total weight of the slurry. The preferred types of surfactants are nonionic, anionic, or mixtures thereof and are most preferably present in a concentration of about 10 ppm to 50 ppm of the total weight of the slurry.

Suitable acid compounds that may be added to the slurry composition include, for example, formic acid, acetic acid, propanoic acid, butanoic acid, pentanoic acid, hexanoic acid, heptanoic acid, octanoic acid, nonanoic acid, lactic acid, hydrochloric acid, nitric acid, phosphoric acid, sulfuric acid, hydrofluoric acid, malic acid, tartaric acid, gluconic acid, citric acid, phthalic acid, pyrocatechoic acid, pyrogallol carboxylic acid, gallic acid, tannic acid, and mixtures thereof. These acid compounds may be present in the slurry composition in a concentration of about 0.01% to 10% of the total weight of the slurry. The preferred acid is carboxylic acid, such as those listed above. Preferably, the carboxylic acid is present in an amount about 0.10% to 7% of the total weight of the slurry.

Suitable corrosion inhibitors that may be added to the slurry composition include, for example, benzotriazole, 6-tolyltriazole, 1-(2,3-dicarboxypropyl)benzotriazole, and mixtures thereof. The corrosion inhibitor may be present in the slurry in a concentration of about 1 ppm to 300 ppm and is preferably present in a concentration of about 50 ppm to 200 ppm of the total weight of the slurry. The preferred corrosion inhibitor is benzotriazole and is most preferably present in a concentration of about 50 ppm to 150 ppm of the total weight of the slurry.

Carboxylic acids, if added, may also impart corrosion inhibition properties to the slurry composition.

To increase the selectivity of tantalum and tantalum compounds relative to silicon oxide, fluorine-containing compounds may be added to the slurry composition. Suitable fluorine-containing compounds include, for example, hydrogen fluoride, perfluoric acid, alkali metal fluoride salt, alkaline earth metal fluoride salt, ammonium fluoride, tetramethylammonium fluoride, ammonium bifluoride, ethylenediammonium difluoride, diethylenetriammonium trifluoride, and mixtures thereof. The fluorine-containing compounds may be present in the slurry composition in a concentration of about 0.01% to 5%, and are preferably present in a concentration of about 0.10% to 2% of the total weight of the slurry. The preferred fluorine-containing compound is ammonium fluoride, most preferably in a concentration from about 0.10% to 1% of the total weight of the slurry.

Suitable chelating agents that may be added to the slurry composition include, for example, ethylenediaminetetracetic acid (EDTA), N-hydroxyethylethylenediaminetriacetic acid (NHEDTA), nitrilotriacetic acid (NTA), diethylklenetriaminepentacetic acid (DPTA), ethanoldiglycinate, and mixtures thereof. The chelating agents may be present in the slurry composition in a concentration of about 0.01% to 1%, and are preferably present in a concentration of about 0.05% to 0.20% of the total weight of the slurry. The preferred chelating agent is EDTA and is most preferably present in a concentration of about 0.05% to 0.20% of the total weight of the slurry.

Suitable amines that may be added to the slurry composition include, for example, hydroxylamine, monoethanolamine, diethanolamine, triethanolamine, diethyleneglycolamine, N-hydroxylethylpiperazine, and mixtures thereof. The amines may be present in the slurry composition in a concentration of about 0.01% to 1%, and are preferably present in a concentration of about 0.01% to 0.20% of the total weight of the slurry. The preferred amine is ammonium hydroxide and is most preferably present in a concentration of about 0.01% to 0.1% of the total weight of the slurry.

Suitable salts that may be added to the slurry composition include, for example, ammonium persulfate, potassium persulfate, potassium sulfite, potassium carbonate, ammonium nitrate, potassium hydrogen phthalate, hydroxylamine sulfate, and mixtures thereof. The salts may be present in the slurry composition in a concentration of about 0.01% to 10%, and are preferably present in a concentration of about 0.02% to 5% of the total weight of the slurry. The preferred salt is ammonium nitrate and is most preferably present in a concentration of about 0.05% to 0.15% of the total weight of the slurry.

Each of the above-described components may be introduced into the continuous process at any suitable time, order and/or manner. By way of example, any of the components can be added to water before or while the abrasive is introduced. Again, by way of example, a process may include adding wetting agent, surfactant and/or any additional components as set forth above to water and then mixing in the abrasive. The composition can then be high shear mixed.

In yet another process according to the present invention, the components are mixed in a continuous process used by Planar Solutions Company. Since its inception, Planar Solutions has utilized a unique continuous process for the production of CMP slurry dispersions and has been recognized for the excellent lot-to-lot consistency and performance of its products. The continuous process allows for the in-line addition of stabilizers, diluents and other additives. SPC has been implemented to monitor all key processes. In addition, advanced ultrasonic mixing and blending technologies as well as the implementation of advanced filtration technology to achieve ultra-low large particle counts (LPC's) and exceptionally low defectivity levels, is equally applicable to the present invention.

The advanced filtration process for use in the present invention uses a series of filters that allow for a continuous reduction in unwanted large particles. Coarse filtration is followed by finer filtration. The novel materials and design allow all the filtration to be accomplished at very high throughput and in a single pass, without a need for re-circulation. This innovative proprietary process has resulted in a consistent low LPC (Large Particle Count) slurry which provides significantly lower defectivity for semiconductor wafers.

In a preferred embodiment of the present invention, the copper CMP slurry composition includes abrasive, oxidizer, corrosion inhibitor and water. One example of such a CMP slurry composition is sold under the tradename Cu10K-2® by Planar Solutions. The Cu10K-2® slurry has fumed silica, oxidizer, corrosion inhibitor, and water, and can be used as the initial slurry in the one-step process of the present invention.

In a preferred embodiment of the present invention, the polishing selectivity of the initial slurry, such as Cu10K-2®, can be changed by the addition of one or more components or modifying agents selected from the group consisting of corrosion inhibitor, oxidizer, carboxylic acid, glycine, pH adjuster, or any combinations thereof.

When corrosion inhibitor, such as, for example, BTA is added to the initial CMP slurry composition, it may be added in an amount about 25 ppm to about 1000 ppm. Preferably, corrosion inhibitor is added in an amount about 25 ppm to about 500 ppm and more preferably about 25 ppm to about 100 ppm, to adjust the polishing selectivity of the initial CMP slurry.

When oxidizer, such as, for example, hydrogen peroxide is added to the initial CMP slurry to adjust the polishing selectivity, it may be added in an amount about 0.01 wt. % to about 4 wt. %. Preferably, the oxidizer is added in an amount about 0.05 wt. % to about 3 wt. % and more preferably about 0.1 wt. % to about 2 wt. %.

When carboxylic acid, such as one or more carboxylic acid compounds previously described, is added to the initial CMP slurry composition to adjust the polishing selectivity, it may be added in an amount about 0.05 wt. % to about 2 wt. %. Preferably, the carboxylic acid is added in an amount about 0.1 wt. % to about 1 wt. % and more preferably about 0.2 wt. % to about 0.9 wt. %.

When glycine is added to the initial CMP slurry composition to adjust the polishing selectivity, it may be added in an amount about 0.1 wt. % to about 3 wt. %. Preferably, the glycine is added in an amount about 0.2 wt. % to about 2 wt. % and more preferably about 0.3 wt. % to about 1 wt. %.

When pH adjuster is added to the initial CMP slurry composition to adjust the polishing selectivity, it may be added in an amount about 0.01 wt. % to about 2 wt. %.

The level of removal of the first layer to be polished can be detected by any detection means known in the art. By way of example, suitable detection means may include optical, laser, acoustic, interference techniques, or any combinations thereof.

It should also be apparent to one skilled in the art that the continuous CMP process of the present invention can be modified to continuously polish more than two different layers on a substrate. This can be accomplished by simply repeating the process parameter adjusting step so that the polishing selectivity is to the layer to be polished, and the polishing step, after each layer to be polished. This process can be carried out until all of the desired additional layers, other than the first and second layers, are polished. It should also be apparent that the chemicals can be added prior to and/or during the polishing and cleaning steps.

This invention is explained below in further detail with reference to the Examples, which are not by way of limitation, but by way of illustration.

EXAMPLE 1

A semiconductor substrate is positioned on a platen for polishing of the copper and tantalum metal layers on the substrate. The initial CMP slurry used has a copper removal rate of greater than about 5000 Å/min. and a tantalum removal rate of about 500 Å/min. The substrate is initially polished until the tantalum barrier layer is detected. Once detected, benzotriazole (BTA) is added to the CMP slurry, or through a separate chemical inlet on the platen in situ, to reduce the copper removal rate to about 1000 Å/min. The slurry is adjusted to a low copper selectivity slurry using the same platen, and without having to stop the polishing process.

EXAMPLE 2

A semiconductor substrate is positioned on a platen for polishing of the copper and tantalum metal layers. A slurry sold under the tradename Cu10K-2® by Planar Solutions, with an oxidizer and BTA, is used with the addition of a copper removal rate enhancer to increase copper removal rates. The enhancer can be, for example, oxidizers like peroxide or complexants like citric acid and its salts. The removal rate increase over the control Cu10K-2® is shown in Table 2 below. The data is collected on a Mirra polisher at 2 psi down force and 90 rpm platen speed. If the down force or platen speed is increased further, the removal rates would be even higher.

TABLE 2

Copper Removal Rate Comparison

| Slurry | Cu removal rate normalized. | |
|---|---|---|
| Cu10K-2 ® | X* | 1.5X at 5 PSI |
| Cu10K-2 ® plus 0.05% Enhancer | 2X | |
| Cu10K-2 ® plus 0.1% Enhancer | 3X | |

*at about 2 psi and 90 rpm, X is about 800 Å/min

The substrate is initially polished with a platen down force of about 5 to 7 pounds psi and a platen speed of about 60 to 90 rpm. Once the tantalum barrier layer is detected, the down force is reduced to about 3 psi and the platen speed is reduced to about 32 rpm, thereby substantially reducing the copper removal rate. The enhancer can be supplied through a separate inlet. The enhancer flow can be reduced or stopped once tantalum is detected, thus reducing the copper removal rate to the Cu10K-2® control. Now, effectively, the second step of the conventional two-step process begins as a part of the first and only step of the continuous process of the present invention.

The present invention has been described with particular reference to the preferred forms thereof. It will be obvious to one of ordinary skill in the art that changes and modifications may be made therein without departing from the spirit and scope of the present invention as defined by the following claims.

What is claimed is:

1. A continuous process for polishing a substrate having at least a first layer, and a second layer, and a third layer disposed thereon, the process comprising the steps of:
   (a) disposing said substrate on a platen;
   (b) polishing said first layer using both a mechanical means and a chemical means;
   (c) polishing said second layer upon adjusting at least one parameter in either said mechanical means, said chemical means, or both; and
   (d) polishing said third layer upon adjusting at least one parameter in either said mechanical means, said chemical means, or both,
   wherein the polishing of said first and second layers occurs without removing said substrate from said platen.

2. The process of claim 1, wherein said chemical means comprises at least one parameter selected from the group consisting of: slurry temperature, slurry concentration, slurry components, slurry pH, and any combinations thereof.

3. The process of claim 2, wherein said slurry temperature is from about 50° F. to about 150° F.

4. The process of claim 2, wherein said slurry concentration is adjusted by dilution with a component selected from the group consisting of: water, chemical solutions, and any combinations thereof.

5. The process of claim 4, wherein said chemical solutions are selected from the group consisting of: rate enhancers, oxidizers, surfactants, catalysts, corrosion inhibitors, and any combinations thereof.

6. The process of claim 2, wherein said slurry components are selected from the group consisting of: oxidizers, stabilizers, corrosion inhibitors, catalysts, complexants, surfactants, and any combinations thereof.

7. The process of claim 2, wherein said slurry pH is between about 2 to about 12.

8. The process of claim 1, wherein said mechanical means comprises at least one parameter selected from the group consisting of: platen downwardly applied force, platen rotational speed, platen back pressure, slurry flow rates, and any combinations thereof.

9. The process of claim 8, wherein said platen downwardly applied force is between about 1 psi to about 10 psi.

10. The process of claim 8, wherein said platen speed is between about 20 rpm to about 200 rpm.

11. The process of claim 1, wherein said adjusting step is carried out in situ.

12. The process of claim 1, wherein said first layer comprises at least one material selected from the group consisting of: copper; aluminum, tungsten, noble metals, and composite metals.

13. The process of claim 1, wherein said second layer comprises at least one material selected from the group consisting of: tantalum, tantalum nitride, titanium, titanium nitride, tungsten, tungsten nitride, other barrier metals and compounds, and composite metals.

14. The process of claim 1, further comprising a step of detecting a predetermined level of removal of said first layer from said substrate prior to polishing said second layer.

15. The process of claim 14, wherein said step of detecting a predetermined level of removal is carried out by a means selected from the group consisting of: optical, laser, acoustic, interference techniques, and any combinations thereof.

16. The process of claim 1, wherein said first layer is conductive and said second layer is non-conductive.

17. The process of claim 1, wherein said process results in about a 33% reduction in polishing time over two step polishing processes.

18. A continuous process for polishing a substrate having a least a first layer, a second layer, and a third layer disposed thereon, the process comprising the steps of:
   (a) disposing said substrate on a platen;
   (b) polishing said first layer using both mechanical means and a composition comprising at least one abrasive and at least one oxidizer;
   (c) adding one or more modifying agents to said composition of step (b) thereby adjusting a polishing selectivity of said composition;

(d) polishing said second layer using both mechanical means and said composition of step (c); and (e) repeating steps (c) and (d) to polish said third layer.

19. The process of claim 18, wherein the polishing of said first and second layers occurs without removing said substrate from said platen.

20. The process of claim 18, wherein said mechanical means comprises at least one parameter selected from the group consisting of: platen downwardly applied force, platen rotational speed, platen back pressure, slurry flow rates, and any combinations thereof.

21. The process of claim 20, wherein said platen downwardly applied force is between about 1 psi to about 10 psi.

22. The process of claim 20, wherein said platen speed is between about 20 rpm to about 200 rpm.

23. The process of claim 20, wherein said slurry flow rate is between about 10 ml/min. to about 500 ml/min.

24. The process of claim 18, wherein said step (c) is carried out in situ.

25. The process of claim 18, wherein said first layer comprises at least one material selected from the group consisting of: copper, aluminum, tungsten, noble metals, and composite metals.

26. The process of claim 18, wherein said second layer comprises at least one material selected from the group consisting of: tantalum, tantalum nitride, titanium, titanium nitride, tungsten, tungsten nitride, other barrier metals and compounds, and composite metals.

27. The process of claim 18, wherein said one or more modifying agents are selected from the group consisting of: oxidizer, corrosion inhibitor, carboxylic acid, glycine, pH adjuster, surfactant, and any combinations thereof.

28. The process of claim 27, wherein said oxidizer is added in an amount about 0.01 wt. % to about 4 wt. %.

29. The process of claim 27, wherein said corrosion inhibitor is present in an amount about 25 ppm to about 1000 ppm.

30. The process of claim 27, wherein said carboxylic acid is added in an amount about 0.05 wt. % to about 2 wt %.

31. The process of claim 27, wherein said glycine is added in an amount about 0.1 wt % to about 3 wt. %.

32. The process of claim 27, wherein said pH adjuster is added in an amount about 0.01 wt. % to about 2 wt. %.

33. The process of claim 27, wherein said surfactant is added in an amount about 1 ppm to about 1000 ppm.

34. The process of claim 18, further comprising a step of detecting a predetermined level of removal of said first layer from said substrate prior to polishing said second layer.

35. The process of claim 34, wherein said step of detecting a predetermined level of removal is carried out by a means selected from the group consisting of: optical, laser, acoustic, interference techniques, and any combinations thereof.

36. The process of claim 18, wherein said first layer is conductive and said second layer is non-conductive.

37. The process of claim 18, wherein said process results in about a 33% reduction in polishing time over two step polishing processes.

38. A continuous process for polishing a substrate having at least a first layer and a second layer disposed thereon, the process comprising the steps of:

(a) disposing said substrate on a platen;

(b) polishing said first layer using both a mechanical means and a chemical means; and (c) polishing said second layer upon adjusting at least one parameter in either said mechanical means, said chemical means, or both, wherein the polishing of said first and second layers occurs without removing said substrate from said platen, and wherein said first layer is conductive and said second layer is non-conductive.

39. The process of claim 38, wherein said chemical means comprises at least one parameter selected from the group consisting of: slurry temperature, slurry concentration, slurry components, slurry pH, and combinations thereof.

40. The process of claim 39, wherein said slurry temperature is from about 50° F. to about 150° F.

41. The process of claim 39, wherein said slurry concentration is adjusted by dilution with a component selected from the group consisting of: water, chemical solutions, and combinations thereof.

42. The process of claim 41, wherein said chemical solutions are selected from the group consisting of: rate enhancers, oxidizers, surfactants, catalysts, corrosion inhibitors, or any combinations thereof.

43. The process of claim 39, wherein said slurry components are selected from the group consisting of: oxidizers, stabilizers, corrosion inhibitors, catalysts, complexants, surfactants, and any combinations thereof.

44. The process of claim 39, wherein said slurry pH is between about 2 to about 12.

45. The process of claim 38, wherein said mechanical means comprises at least one parameter selected from the group consisting of: platen downwardly applied force, platen rotational speed, platen back pressure, slurry flow rates, and combinations thereof.

46. The process of claim 45, wherein said platen downwardly applied force is between about 1 psi to about 10 psi.

47. The process of claim 45, wherein said platen speed is between about 20 rpm to about 200 rpm.

48. The process of claim 38, wherein said adjusting step is carried out in situ.

49. The process of claim 38, wherein said first layer comprises at least one material selected from the group consisting of: copper, aluminum, tungsten, noble metals, and composite metals.

50. The process of claim 38, further comprising a step of detecting a predetermined level of removal of said first layer from said substrate prior to polishing said second layer.

51. The process of claim 50, said step of detecting a predetermined level of removal is carried out by a means selected from the group consisting of; optical, laser, acoustic, interference techniques, and any combinations thereof.

52. The process of claim 38, further comprising the step of repeating said adjusting step to polish at least one additional layer disposed on said substrate.

53. The process of claim 38, wherein said process results in about a 33% reduction in polishing time over two step polishing processes.

54. A continuous process for polishing a substrate having a least a first layer and a second layer disposed thereon, the process comprising the steps of:

(a) disposing said substrate on a platen;

(b) polishing said first layer using both mechanical means and a composition comprising at least one abrasive and at least one oxidizer;

(c) adding one or more modifying agents to said composition of step (b) thereby adjusting a polishing selectivity of said composition; and (d) polishing said second layer using both mechanical means and said composition of step (c), wherein said first layer is conductive and said second layer is non-conductive.

55. The process of claim 54, wherein the polishing of said first and second layers occurs without removing said substrate from said platen.

56. The process of claim 54, wherein said mechanical means comprises at least one parameter selected from the group consisting of: platen downwardly applied force, platen rotational speed, platen back pressure, slurry flow rates, and any combinations thereof.

57. The process of claim 56, wherein said platen downwardly applied force is between about 1 psi to about 10 psi.

58. The process of claim 56, wherein said platen speed is between about 20 rpm to about 200 rpm.

59. The process of claim 56, wherein said slurry flow rate is between about 10 ml/min. to about 50 ml/min.

60. The process of claim 54, wherein said step (c) is carried out in situ.

61. The process of claim 54, wherein said first layer comprises at least one material selected from the group consisting of: copper, aluminum, tungsten, noble metals, and composite metals.

62. The process of claim 54, wherein said one or more modifying agents are selected from the group consisting of: oxidizer, corrosion inhibitor, carboxylic acid, glycine, pH adjuster, surfactant, and any combinations thereof.

63. The process of claim 62, wherein said oxidizer is added in an amount about 0.01 wt. % to about 4 wt. %.

64. The process of claim 62, wherein said corrosion inhibitor is present in an amount about 25 ppm to about 1000 ppm.

65. The process of claim 62, wherein said carboxylic acid is added in an amount about 0.05 wt. % to about 2 wt. %.

66. The process of claim 62, wherein said glycine is added in an amount about 0.1 wt. % to about 3 wt. %.

67. The process of claim 62, wherein said pH adjuster is added in an amount about 0.01 wt. % to about 2 wt. %.

68. The process of claim 62, wherein said surfactant is added in an amount about 1 ppm to about 1000 ppm.

69. The process of claim 54, further comprising a step of detecting a predetermined level of removal of said first layer from said substrate prior to polishing said second layer.

70. The process of claim 69, wherein said step of detecting a predetermined level of removal is carried out by a means selected from the group consisting of: optical, laser, acoustic, interference techniques, and any combinations thereof.

71. The process of claim 54, further comprising, after step (d), the step of repeating steps (c) and (d) to polish at least one additional layer disposed on said substrate.

72. The process of claim 54, wherein said process results in about a 33% reduction in polishing time over two step polishing processes.

* * * * *